(12) United States Patent
Navet et al.

(10) Patent No.: US 11,339,089 B2
(45) Date of Patent: May 24, 2022

(54) NEUTRAL COLOR ANTIREFLECTIVE GLASS SUBSTRATE AND METHOD FOR MANUFACTURING THE SAME

(71) Applicants: AGC GLASS EUROPE, Louvain-la-Neuve (BE); AGC GLASS COMPANY NORTH AMERICA, Alpharetta, GA (US); AGC Inc., Chiyoda Ku (JP); QUERTECH INGENIERIE, Caen (FR)

(72) Inventors: Benjamine Navet, Louvain-la-Neuve (BE); Pierre Boulanger, Couthuin (BE); Denis Busardo, Gonneville sur Mer (FR)

(73) Assignees: AGC GLASS EUROPE, Louvain-la-Neuve (BE); AGC GLASS COMPANY NORTH AMERICA, Alpharetta, GA (US); AGC Inc., Chiyoda Ku (JP); QUERTECH INGENIERIE, Caen (FR)

( * ) Notice: Subject to any disclaimer, the term of this patent is extended or adjusted under 35 U.S.C. 154(b) by 498 days.

(21) Appl. No.: 16/092,395

(22) PCT Filed: Mar. 13, 2017

(86) PCT No.: PCT/EP2017/055853
§ 371 (c)(1),
(2) Date: Oct. 9, 2018

(87) PCT Pub. No.: WO2017/178170
PCT Pub. Date: Oct. 19, 2017

(65) Prior Publication Data
US 2020/0325067 A1    Oct. 15, 2020

(30) Foreign Application Priority Data

Apr. 12, 2016   (EP) .................... 16164906

(51) Int. Cl.
| | | |
|---|---|---|
| C03C 23/00 | (2006.01) |
| C03C 3/097 | (2006.01) |
| C03C 3/087 | (2006.01) |
| B32B 17/10 | (2006.01) |
| B60J 1/00 | (2006.01) |
| C03C 3/062 | (2006.01) |
| C03C 3/064 | (2006.01) |
| C03C 3/078 | (2006.01) |
| C03C 3/083 | (2006.01) |
| C03C 3/085 | (2006.01) |
| C03C 3/089 | (2006.01) |
| C03C 3/091 | (2006.01) |
| C03C 4/02 | (2006.01) |
| C03C 4/18 | (2006.01) |
| C23C 14/58 | (2006.01) |
| C23C 14/48 | (2006.01) |

(52) U.S. Cl.
CPC .... *C03C 23/0055* (2013.01); *B32B 17/10036* (2013.01); *B32B 17/10128* (2013.01); *B60J 1/001* (2013.01); *C03C 3/062* (2013.01); *C03C 3/064* (2013.01); *C03C 3/078* (2013.01); *C03C 3/083* (2013.01); *C03C 3/085* (2013.01); *C03C 3/087* (2013.01); *C03C 3/089* (2013.01); *C03C 3/091* (2013.01); *C03C 3/097* (2013.01); *C03C 4/02* (2013.01); *C03C 4/18* (2013.01); *C23C 14/48* (2013.01); *C23C 14/5833* (2013.01); *B32B 2307/4026* (2013.01); *B32B 2310/0881* (2013.01); *B32B 2315/08* (2013.01); *B32B 2605/006* (2013.01); *B32B 2605/08* (2013.01)

(58) Field of Classification Search
CPC ...................................... C23C 13/48
See application file for complete search history.

(56) References Cited

U.S. PATENT DOCUMENTS

2015/0376058 A1* 12/2015 Busardo .............. C03C 23/0055
                                                            428/426
2016/0052821 A1    2/2016 Busardo et al.

FOREIGN PATENT DOCUMENTS

WO   WO-2014125211 A2 *  8/2014  ......... C03C 23/0055
WO   WO 2016/062779 A1   4/2016

OTHER PUBLICATIONS

International Search Report dated May 8, 2017, in PCT/EP2017/055853 filed Mar. 13, 2017.

* cited by examiner

Primary Examiner — Dah-Wei D. Yuan
Assistant Examiner — Kristen A Dagenais-Englehart
(74) Attorney, Agent, or Firm — Oblon, McClelland, Maier & Neustadt, L.L.P.

(57) ABSTRACT

A method for manufacturing neutral color antireflective glass substrates by ion implantation, the method including ionizing a $N_2$ source gas so as to form a mixture of single charge and multicharge ions of N, forming a beam of single charge and multicharge ions of N by accelerating with an acceleration voltage A between 20 kV and 25 kV and setting the ion dosage at a value between $6 \times 10^{16}$ ions/$cm^2$ and $-5.00 \times 10^{15} \times A/kV + 2.00 \times 10^{17}$ ions/$cm^2$. A neutral color antireflective glass substrates including an area treated by ion implantation with a mixture of simple charge and multicharge ions according to the method.

16 Claims, No Drawings

NEUTRAL COLOR ANTIREFLECTIVE GLASS SUBSTRATE AND METHOD FOR MANUFACTURING THE SAME

The present invention relates to a neutral color antireflective glass substrate and a method of manufacturing the same. It also relates to the use of a neutral color antireflective glass substrate, particularly as glazing.

Most antireflective glass substrates are obtained by the deposition of coatings on the glass surface. Reduction of light reflectance is obtained by single layers having refractive indexes that are lower than the refractive index of the glass substrate or that have a refractive index gradient. High performance antireflective glass substrates are obtained by stacks of multiple layers that make use of interference effects in order to obtain a significant reduction of light reflectance over the whole visible range. Such high performance antireflective layer stacks, applied to both sides of the substrate, are able to reduce the light reflectance of a typical glass substrate from about 8% to 4% or even less. However they require multiple layer deposition steps with a high composition and layer thickness control, making it a difficult and thus expensive process. Furthermore single neutral color antireflective layers and in particular multiple layer stacks, usually deposited by physical vapor deposition, are more sensitive to mechanical and/or chemical attack than the glass itself. Single layer antireflective layers often present colors in reflection that are not neutral and neutral color multiple layer antireflective coatings require an even larger number of layers, making the resulting layer stack even more sensitive.

Another antireflective glass substrate has been disclosed in FR1300336. Here an antireflection effect is obtained by implanting heavy ions of noble gases at a concentration of 10 atomic % up to depths of 100 nm or 200 nm into the surface of a glass substrate. However noble gases are relatively expensive and the need to reach such high concentrations of the implanted noble gas ions in the glass substrate increases the risk of creating important damage to the glass network. Furthermore these glass substrates are not neutral in reflection.

There is therefore a need in the art to provide a simple, inexpensive method of making a neutral color antireflective glass substrate.

According to one of its aspects, the subject of the present invention is to provide a method for producing a neutral color antireflective glass substrate.

According to another of its aspects, the subject of the present invention is to provide a neutral color antireflective glass substrate.

The invention relates to a method for producing a neutral color antireflective glass substrate comprising the following operations
  providing a $N_2$ source gas,
    ionizing the $N_2$ source gas so as to form a mixture of single charge ions and multicharge ions of N,
    accelerating the mixture of single charge ions and multicharge ions of N with an acceleration voltage so as to form a beam of single charge ions and multicharge ions of N, wherein the acceleration voltage A is comprised between 20 kV and 25 kV and the dosage D is comprised between $6 \times 10^{16}$ ions/cm$^2$ and $-5.00 \times 10^{15} \times$ A/kV$+2.00 \times 10^{17}$ ions/cm$^2$,
  providing a glass substrate,
  positioning the glass substrate in the trajectory of the beam of single charge and multicharge ions of N.

The inventors have surprisingly found that the method of the present invention providing an ion beam comprising a mixture of single charge and multicharge ions of N, accelerated with the same specific acceleration voltage and at such specific dosage, applied to a glass substrate, leads to a reduced reflectance. Advantageously the reflectance of the resulting glass substrate is decreased from about 8% to at most 6.5%, preferably at most 6%, more preferably at most 5.5%. Most surprisingly this low level of reflectance is reached whereas the concentration of implanted N is below 2 atomic % throughout the implanted depth and furthermore the color in reflection, expressed by the color coordinates of a* and b* in reflectance, is neutral, that is $-1 \leq a^* \leq 1$ and $-1 \leq b^* \leq 1$, or even is very neutral, that is $-0.3 \leq a^* \leq 0.3$ and $-0.3 \leq b^* \leq 0.3$.

According to the present invention the $N_2$ source gas is ionized so as to form a mixture of single charge ions and multicharge ions of N. The beam of accelerated single charge ions and multicharge ions may comprise various amounts of the different N ions. Preferably the beam of accelerated single charge and multicharge ions comprises $N^+$, $N^{2+}$ and $N^{3+}$.

Example currents of the respective ions are shown in Table 1 below (measured in milli Ampère).

TABLE 1

| Ions of N | |
|---|---|
| $N^+$ | 0.55 mA |
| $N^{2+}$ | 0.60 mA |
| $N^{3+}$ | 0.24 mA |

According to the present invention, the key ion implantation parameters are the ion acceleration voltage and the ion dosage.

The positioning of the glass substrate in the trajectory of the beam of single charge and multicharge ions is chosen such that certain amount of ions per surface area or ion dosage is obtained. The ion dosage or dosage is expressed as number of ions per square centimeter. For the purpose of the present invention the ion dosage is the total dosage of single charge ions and multicharge ions. The ion beam preferably provides a continuous stream of single and multicharge ions. The ion dosage is controlled by controlling the exposure time of the substrate to the ion beam. According to the present invention multicharge ions are ions carrying more than one positive charge. Single charge ions are ions carrying a single positive charge.

In one embodiment of the invention the positioning comprises moving glass substrate and ion implantation beam relative to each other so as to progressively treat a certain surface area of the glass substrate. Preferably they are moved relative to each other at a speed comprised between 0.1 mm/s and 1000 mm/s. The speed of the movement of the glass relative to the ion implantation beam is chosen in an appropriate way to control the residence time of the sample in the beam which influences ion dosage of the area being treated.

The method of the present invention can be easily scaled up so as to treat large substrates of more than 1 m$^2$, for example by continuously scanning the substrate surface with an ion beam of the present invention or for example by forming an array of multiple ion sources that treat a moving substrate over its whole width in a single pass or in multiple passes.

The inventors have found that ion sources providing an ion beam comprising a mixture of single charge and multi-charge ions, accelerated with the same acceleration voltage are particularly useful as they may provide lower dosages of multicharge ions than of single charge ions. It appears that a neutral color antireflective glass substrate may be obtained with the mixture of single charge ions, having higher dosage and lower implantation energy, and multicharge ions, having lower dosage and higher implantation energy, provided in such a beam. The implantation energy, expressed in Electron Volt (eV) is calculated by multiplying the charge of the single charge ion or multicharge ion with the acceleration voltage.

In a preferred embodiment of the present invention the temperature of the area of the glass substrate being treated, situated under the area being treated is less than or equal to the glass transition temperature of the glass substrate. This temperature is for example influenced by the ion current of the beam, by the residence time of the treated area in the beam and by any cooling means of the substrate.

In one embodiment of the invention several ion implantation beams are used simultaneously or consecutively to treat the glass substrate.

In one embodiment of the invention the total dosage of ions per surface unit of an area of the glass substrate is obtained by a single treatment by an ion implantation beam.

In another embodiment of the invention the total dosage of ions per surface unit of an area of the glass substrate is obtained by several consecutive treatments by one or more ion implantation beams.

In a preferred embodiment the glass substrate is treated on both of its faces with the method according to the present invention so as to maximize the low reflectance effect.

The method of the present invention is preferably performed in a vacuum chamber at a pressure comprised between $10^{-2}$ mbar and $10^{-7}$ mbar, more preferably at a pressure comprised between $10^{-5}$ mbar and $10^{-6}$ mbar.

An example ion source for carrying out the method of the present invention is the Hardion+ RCE ion source from Quertech Ingénierie S.A.

The reflectance is measured on the side of the substrate treated with the ion implantation method of the present invention using illuminant D65 and a 2° observer angle. The color in reflection is expressed using CIELAB color coordinates a* and b* under illuminant D65 using 10° observer angle and is measured on the side of the substrate treated with the method of the present invention. CIE L*a*b* or CIELAB is a color space specified by the International Commission on Illumination.

The present invention also concerns the use of a mixture of single charge and multicharge ions of N to decrease the reflectance of a glass substrate and at the same time keep the color in reflectance neutral, the mixture of single charge and multicharge ions being implanted in the glass substrate with an ion dosage and an acceleration voltage effective to reduce the reflectance of the glass substrate and at the same time keep the color in reflectance neutral.

Advantageously the mixture of single and multicharge ions of N is being implanted in the glass substrate with an ion dosage and an acceleration voltage effective to reduce the reflectance of a glass substrate to at most 6.5%, preferably to at most 6%, more preferably to at most 5.5%. At the same time the color in reflectance is kept neutral, that is $-1 \leq a^* \leq 1$ and $-1 \leq b^* \leq 1$.

The reflectance of the glass substrate before the treatment is about 8%.

More advantageously the mixture of single and multicharge ions of N is used to reduce the reflectance of a glass substrate to at most 6.5%, preferably to at most 6%, more preferably to at most 5.5%. At the same time the color in reflectance is kept very neutral, that is $-0.3 \leq a^* \leq 0.3$ and $-0.3 \leq b^* \leq 0.3$.

According to the present invention, the mixture of single charge and multicharge ions of N preferably comprises $N^+$, $N^{2+}$ and $N^{3+}$.

According to the present invention the acceleration voltage and ion dosage effective to reduce reflectance of the glass substrate and at the same time keep the color in reflectance neutral are preferably comprised in the following ranges:

TABLE 2

| parameter | preferred range |
| --- | --- |
| Acceleration voltage A [kV] | 20 to 25 |
| Ion dosage D [ions/cm²] | $6 \times 10^{16}$ to $-5.00 \times 10^{15} \times$ A/kV + $2.00 \times 10^{17}$ |

The present invention also concerns an ion implanted glass substrate having reduced reflectance, wherein a mixture of single charge and multicharge ions of N has been implanted according to the method of the present invention.

Advantageously the ion implanted glass substrates of the present invention, have a reflectance of at most 6.5%, preferably at most 6% more preferably at most 5.5%. They also have a neutral color in reflectance, that is $-1 \leq a^* \leq 1$ and $-1 \leq b^* \leq 1$, preferably $-0.3 \leq a^* \leq 0.3$ and $-0.3 \leq b^* \leq 0.3$ In a preferred embodiment of the present invention the ions implanted in the glass substrates of the present invention are single charge and multicharge ions of N.

According to another preferred embodiment of the present invention, mixture of single charge and multicharge ions of N comprises a lesser amount of $N^{3+}$ than of $N^+$ and $N^{2+}$ each. In a more preferred embodiment of the present invention the mixture of single charge and multicharge ions of N comprises 40-70% of $N^+$, 20-40% of $N^{2+}$, and 2-20% of $N^{3+}$.

Advantageously the implantation depth of the ions may be comprised between 0.1 μm and 1 μm, preferably between 0.1 μm and 0.5 μm.

The glass substrate used in the present invention is usually a sheet like glass substrate having two opposing major surfaces. The ion implantation of the present invention may be performed on one or both of these surfaces. The ion implantation of the present invention may be performed on part of a surface or on the complete surface of the glass substrate.

In another embodiment, the present invention also concerns glazings incorporating antireflective glass substrates of the present invention, no matter whether they are monolithic, laminated or multiple with interposed gas layers.

These glazings can be used both as internal and external building glazings, and as protective glass for objects such as panels, display windows, glass furniture such as a counter, a refrigerated display case, etc., also as automotive glazings such as laminated windshields, mirrors, antiglare screens for computers, displays and decorative glass.

The glazing incorporating the antireflection glass substrate according to the invention may have interesting additional properties. Thus, it can be a glazing having a security function, such as the laminated glazings. It can also be a glazing having a burglar proof, sound proofing, fire protection or antibacterial function.

The glazing can also be chosen in such a way that the substrate treated on one of its faces with the method according to the present invention, comprises a layer stack deposited on the other of its faces. The stack of layers may have a specific function, e.g., sun-shielding or heat-absorbing, or also having an anti-ultraviolet, antistatic (such as slightly conductive, doped metallic oxide layer) and low-emissive, such as silver-based layers of the or doped tin oxide layers. It can also be a layer having anti-soiling properties such as a very fine $TiO_2$ layer, or a hydrophobic organic layer with a water-repellent function or hydrophilic layer with an anti-condensation function.

The layer stack can be a silver comprising coating having a mirror function and all configurations are possible. Thus, in the case of a monolithic glazing with a mirror function, it is of interest to position an antireflective glass substrate of the present invention with the treated face as face 1 (i.e., on the side where the spectator is positioned) and the silver coating on face 2 (i.e., on the side where the mirror is attached to a wall), the antireflection stack according to the invention thus preventing the splitting of the reflected image.

In the case of a double glazing (where according to convention the faces of glass substrates are numbered starting with the outermost face), it is thus possible to use the antireflective treated face as face 1 and the other functional layers on face 2 for anti-ultraviolet or sun-shielding and 3 for low-emissive layers. In a double glazing, it is thus possible to have at least one antireflective face as one of the faces of the substrates and at least one layer or a stack of layers providing a supplementary functionality. The double glazing can also have several antireflective treated faces, particularly at least on faces 2, 3, or 4. For a monolithic glazing 1 it is possible to deposit an antistatic function layer, associated with an antireflection face.

The substrate may also undergo a surface treatment, particularly acid etching (frosting), the ion implantation treatment may be performed on the etched face or on the opposite face.

The substrate, or one of those with which it is associated, can also be of the printed, decorative glass type or can be screen process printed.

A particularly interesting glazing incorporating the antireflective glass substrate according to the invention is a glazing having a laminated structure with two glass substrates, comprising a polymer type assembly sheet between an antireflective glass substrate of the present invention, with the ion implantation treated surface facing away from the polymer assembly sheet, and another glass substrate. The polymer assembly sheet can be from polyvinylbutyral (PVB) type, polyvinyl acetate (EVA) type or polycyclohexane (COP) type. Preferably, the another glass substrate is an antireflective glass substrate according to the present invention.

This configuration, particularly with two heat treated, that is bent and/or tempered, substrates, makes it possible to obtain a car glazing and in particular a windshield of a very advantageous nature. The standards require cars to have windshields with a high light transmission of at least 75% in normal incidence. Due to the incorporation of the heat treated antireflective glass substrate in a laminated structure of a conventional windshield, the light transmission of the glazing is particularly improved, so that its energy transmission can be slightly reduced by other means, while still remaining within the light transmission standards. Thus, the sun-shielding effect of the windshield can be improved, e.g., by absorption of the glass substrates. The light reflection value of a standard, laminated windshield can be brought from 8% to less than 5%.

The glass substrate according to this invention may be a glass sheet of any thickness having the following composition ranges expressed as weight percentage of the total weight of the glass:

| | |
|---|---|
| $SiO_2$ | 35-85%, |
| $Al_2O_3$ | 0-30%, |
| $P_2O_5$ | 0-20% |
| $B_2O_3$ | 0-20%, |
| $Na_2O$ | 0-25%, |
| $CaO$ | 0-20%, |
| $MgO$ | 0-20%, |
| $K_2O$ | 0-20%, and |
| $BaO$ | 0-20%. |

The glass substrate according to this invention is preferably a glass sheet chosen among a soda-lime glass sheet, a borosilicate glass sheet, or an aluminosilicate glass sheet. In a particularly preferred embodiment the glass sheet is a clear glass sheet.

The glass substrate according to this invention preferably bears no coating on the side being subjected to ion implantation.

The glass substrate according to the present invention may be a large glass sheet that will be cut to its final dimension after the ion implantation treatment or it may be a glass sheet already cut to its final size.

Advantageously the glass substrate of the present invention may be a float glass substrate. The ion implantation method of the present invention may be performed on the air side of a float glass substrate and/or the tin side of a float glass substrate. Preferably the ion implantation method of the present invention is performed on the air side of a float glass substrate.

In an embodiment of the present invention the glass substrate may be a previously chemically strengthened glass substrate.

The optical properties were measured using a Hunterlab Ultrascan Pro Spectrophotometer.

DETAILED DESCRIPTION OF PARTICULAR EMBODIMENTS

The ion implantation examples were prepared according to the various parameters detailed in the tables below using an RCE ion source for generating a beam of single charge and multicharge ions. The ion source used was a Hardion+ RCE ion source from Quertech Ingénierie S.A.

All samples had a size of 10×10 cm$^2$ and were treated on the entire surface by displacing the glass substrate through the ion beam at a speed between 20 and 30 mm/s.

The temperature of the area of the glass substrate being treated was kept at a temperature less than or equal to the glass transition temperature of the glass substrate.

For all examples the implantation was performed in a vacuum chamber at a pressure of $10^{-6}$ mbar.

Ions of N were implanted in 4 mm regular clear soda-lime glass and alumino-silicate glass substrates. Before being implanted with the ion implantation method of the present invention the reflectance of the glass substrates was about 8%. The key implantation parameters and optical measurements can be found in the table below.

TABLE 4

| reference | Source gas | glass substrate | acceleration voltage [kV] | ion dosage [ions/cm$^2$] | Light reflectance [%, D65, 2°] | a* reflectance [CIELAB, D65, 10°] | b* reflectance [CIELAB, D65, 10°] |
|---|---|---|---|---|---|---|---|
| E1 | N$_2$ | Sodalime | 25 | 6 × 10$^{16}$ | 6.50 | −0.14 | −0.57 |
| E2 | N$_2$ | Sodalime | 20 | 6 × 10$^{16}$ | 6.14 | −0.22 | 0.40 |
| E3 | N$_2$ | Sodalime | 20 | 8 × 10$^{16}$ | 5.67 | −0.01 | −0.07 |
| E4 | N$_2$ | Sodalime | 20 | 1 × 10$^{17}$ | 6.50 | −0.25 | −0.03 |
| E5 | N$_2$ | Sodalime | 25 | 7.5 × 10$^{16}$ | 5.25 | 0.20 | 0.02 |
| E6 | N$_2$ | Alumino-silicate | 20 | 6 × 10$^{16}$ | 5.85 | 0.17 | −0.96 |
| C1 | N$_2$ | Sodalime | | | 7.90 | −0.53 | −0.56 |
| C2 | N$_2$ | Sodalime | 25 | 9 × 10$^{16}$ | 5.15 | 0.33 | −1.19 |
| C3 | N$_2$ | Sodalime | 25 | 2.5 × 10$^{17}$ | 5.76 | −0.93 | −4.84 |
| C4 | N$_2$ | Sodalime | 35 | 1 × 10$^{17}$ | 6.37 | −1.12 | −5.16 |

As can be seen from examples E1 to E6 of the present invention, the chosen key parameters used for the ion implantation, where acceleration voltage A is comprised between 20 kV and 25 kV and the dosage D is comprised between 6×10$^{16}$ ions/cm$^2$ and −5.00×10$^{15}$×A/kV+2.00×10$^{17}$ ions/cm$^2$, lead on one hand to a reduced reflectance of at most 6.5%, at most 6.0% or even at most 5.5% and on the other hand the color in reflectance of these examples is neutral, that is −1≤a*≤1 and −1≤b*≤1. The key implantation parameters chosen for examples E3, E4, and E5 lead to a very neutral color in reflectance, that is −0.3≤a*≤0.3 and −0.3≤b*≤0.3.

Furthermore XPS measurements were made on the examples E1 to E6 of the present invention and it was found that the atomic concentration of implanted ions of N is below 8 atomic % throughout the implantation depth.

The invention claimed is:

1. A method for producing a neutral color antireflective glass substrate, the method comprising:
   a) providing a N2 source gas;
   b) ionizing the N2 source gas so as to form a mixture of single charge ions and multicharge ions of N;
   c) accelerating the mixture of single charge ions and multicharge ions of N with an acceleration voltage A so as to form a beam of single charge ions and multicharge ions, wherein the acceleration voltage A is comprised between 20 kV and 25 kV and an ion dosage D is comprised between 7.5×10$^{16}$ ions/cm$^2$ and −5.00× 10$^{15}$×A/kV+2.00×10$^{17}$ ions/cm$^2$;
   d) providing a glass substrate; and
   e) positioning the glass substrate in a trajectory of the beam of single charge and multicharge ions of N, wherein the glass substrate has a neutral color reflectance such that the reflectance is −1≤a*≤1 and −1≤b*≤1 as measured under illuminant D65 using 10° observer angle on a side of the substrate that is treated as specified by the International Commission on Illumination after the mixture of single charge ions and multicharge ions of N has been implanted in the glass substrate.

2. The method for producing a neutral color antireflective glass substrate according to claim 1, wherein the glass substrate comprises the following composition ranges expressed as weight percentage of the total weight of the glass:

| | |
|---|---|
| SiO$_2$ | 35-85%, |
| Al$_2$O$_3$ | 0-30%, |
| P$_2$O$_5$ | 0-20%, |
| B$_2$O$_3$ | 0-20%, |
| Na$_2$O | 0-25%, |
| CaO | 0-20%, |
| MgO | 0-20%, |
| K$_2$O | 0-20%, and |
| BaO | 0-20%. |

3. The method for producing a neutral color antireflective glass substrate according to claim 2, wherein the glass substrate is selected from the group consisting of a soda-lime glass sheet, a borosilicate glass sheet and an aluminosilicate glass sheet.

4. A method, comprising employing a mixture of single charge and multicharge ions of N to decrease the reflectance of a glass substrate and at the same time keep a color in reflectance neutral, the mixture of single charge and multicharge ions being implanted in the glass substrate with an ion dosage D and an acceleration voltage A effective to reduce the reflectance of the glass substrate and at the same time keep the color in reflectance neutral,
wherein the acceleration voltage A is between 20 kV and 25 kV and the ion dosage D is between 7.5×10$^{16}$ ions/cm$^2$ and −5.00×10$^{15}$×A/kV+2.00×10$^{17}$ ions/cm$^2$ wherein the glass substrate has a neutral color in reflectance such that the reflectance is −1<a*<1 and −1<b*<1 as measured under illuminant D65 using 10° observer angle on a side of the substrate that is treated as specified by the International Commission on Illumination after the mixture of single charge ions and multicharge ions of N has been implanted in the glass substrate.

5. The method according to claim 4, wherein the mixture of single charge and multicharge ions is being implanted in the glass substrate with an ion dosage and an acceleration voltage effective to reduce the reflectance of the glass substrate to at most 6.5%.

6. The method according to claim 5, wherein the mixture of single charge and multicharge ions is being implanted in the glass substrate with an ion dosage and an acceleration voltage effective to reduce the reflectance of the glass substrate to at most 6.5% and at the same time keep the color in reflectance neutral such that −0.3≤a*≤0.3 and −0.3≤b*≤0.3.

7. The method of claim 1, wherein said antireflective glass substrate is frosted, printed or screen process printed.

8. The method of claim 1, wherein said substrate is tinted, tempered, reinforced, bent, folded or ultraviolet filtering.

9. The method for producing a neutral color antireflective glass substrate according to claim 3, wherein the glass substrate is a soda-lime glass sheet.

10. The method for producing a neutral color antireflective glass substrate according to claim 1, wherein the ions are implanted to an implantation depth of from 01. μm to 1 μm.

11. The method for producing a neutral color antireflective glass substrate according to claim 1, wherein the glass substrate has a neutral color in reflectance such that $-0.3 \leq a^* \leq 0.3$ and $-0.3 \leq b^* \leq 0.3$ after the mixture of single charge ions and multicharge ions of N has been implanted in the glass substrate.

12. The method for producing a neutral color antireflective glass substrate according to claim 4, wherein the glass substrate comprises the following composition ranges expressed as weight percentage of the total weight of the glass:

| | |
|---|---|
| $SiO_2$ | 35-85%, |
| $Al_2O_3$ | 0-30%, |
| $P_2O_5$ | 0-20%, |
| $B_2O_3$ | 0-20%, |
| $Na_2O$ | 0-25%, |
| CaO | 0-20%, |
| MgO | 0-20%, |
| $K_2O$ | 0-20%, and |
| BaO | 0-20%. |

13. The method for producing a neutral color antireflective glass substrate according to claim 12, wherein the glass substrate is a soda-lime glass sheet.

14. The method for producing a neutral color antireflective glass substrate according to claim 4, wherein the ions are implanted to an implantation depth of from 01. μm to 1 μm.

15. The method for producing a neutral color antireflective glass substrate according to claim 1, wherein the acceleration voltage A is between 20 kV and 25 kV and the dosage D is between $8 \times 10^{16}$ ions/cm$^2$ and $-5.00 \times 10^{15} \times A/kV + 2.00 \times 10^{17}$ ions/cm$^2$.

16. The method for producing a neutral color antireflective glass substrate according to claim 1, wherein the acceleration voltage A is between 20 kV and 25 kV and the dosage D is between $1 \times 10^{17}$ ions/cm$^2$ and $-5.00 \times 10^{15} \times A/kV + 2.00 \times 10^{17}$ ions/cm$^2$.

* * * * *